United States Patent [19]

Rieger

[11] Patent Number: 5,666,316

[45] Date of Patent: Sep. 9, 1997

[54] INTEGRATED SEMINCONDUCTOR MEMORY

[75] Inventor: Johann Rieger, Zell, Germany

[73] Assignee: Siemens Aktiengesellschaft, Munich, Germany

[21] Appl. No.: 694,534

[22] Filed: Aug. 9, 1996

[30] Foreign Application Priority Data

Aug. 9, 1995 [EP] European Pat. Off. ............. 95112548

[51] Int. Cl.$^6$ .................................................. G11C 29/00
[52] U.S. Cl. ..................................... 365/200; 365/230.06
[58] Field of Search ................................. 365/200, 201, 365/230.03, 189.07, 230.06

[56] References Cited

U.S. PATENT DOCUMENTS

| | | | |
|---|---|---|---|
| 4,914,632 | 4/1990 | Kazuyasu et al. | 365/200 |
| 5,475,648 | 12/1995 | Fujiwara | 365/200 |
| 5,528,540 | 6/1996 | Shibata et al. | 365/200 |

FOREIGN PATENT DOCUMENTS

| | | |
|---|---|---|
| 0 554 052 A2 | 8/1993 | European Pat. Off. . |
| 42 41 327 A1 | 6/1993 | Germany . |
| 93/21578 | 10/1993 | WIPO . |

*Primary Examiner*—David C. Nelms
*Assistant Examiner*—Vu A. Le
*Attorney, Agent, or Firm*—Herbert L. Lerner; Laurence A. Greenberg

[57] ABSTRACT

Integrated semiconductor memory having normal memory cells arranged at intersections of word lines and bit lines, decoders for selecting a word line as a function of applicable word line address signals decoders for selecting a bit line as a function of applicable bit line address signals, external reading and evaluator circuits associated with the bit lines of the normal memory cells and connected on an output side thereof with data lines whereat data content is to be output, and redundant memory cells, additionally, by at least one programmable redundant decoder for replacing a defective memory cell, includes external redundant reading and evaluator circuits triggerable by the at least one programmable redundant decoder and associated with the redundant memory cells, the external redundant reading and evaluator circuits being connectible on the input side with the redundant memory cells and on the output side with the data lines, and a redundant control circuit associated with each of the external redundant reading and evaluator circuits, the redundant control circuit being connected to and between the respective associated external redundant reading and evaluator circuit and the data lines and, as a function of a redundant selection signal which is output by the redundant decoder, enabling the data content of a redundant memory cell present at the output of an external redundant reading and evaluator circuit to be transmitted to a selected data line.

9 Claims, 4 Drawing Sheets ated semiconductor memory having a redundant device with normal memory cells, which are arranged in a matrix at intersections of word lines and bit lines, word line decoders for selecting a word line as a function of word line address signals which are applicable to the semiconductor memory, bit line decoders for selecting a bit line as a function of bit line address signals which are applicable to the semiconductor memory, external reading and evaluator circuits associated with the bit lines of the normal memory cells and connected on an output side thereof with data lines at which data content to be read out of the normal memory cells is to be output, and redundant memory cells which, by means of at least one programmable redundant decoder, are addressable for replacing a defective memory cell.

INTEGRATED SEMINCONDUCTOR MEMORY

BACKGROUND OF THE INVENTION

FIELD OF THE INVENTION

The invention relates to an integrated semiconductor memory having a redundant device with normal memory cells, which are arranged in a matrix at intersections of word lines and bit lines, word line decoders for selecting a word line as a function of word line address signals which are applicable to the semiconductor memory, bit line decoders for selecting a bit line as a function of bit line address signals which are applicable to the semiconductor memory, external reading and evaluator circuits associated with the bit lines of the normal memory cells and connected on an output side thereof with data lines at which data content to be read out of the normal memory cells is to be output, and redundant memory cells which, by means of at least one programmable redundant decoder, are addressable for replacing a defective memory cell.

In modern integrated semiconductor memories, memory cells are disposed in a plurality of memory field block units. In operation, to save electric current and time, as a rule, only one memory field block unit is activated at any one time as a function of address signals. To increase the yield when these semiconductor memories are manufactured, it has become known to provide redundant lines with redundant memory cells along the redundant lines. In operation, when necessary or, in other words, when redundant memory cells are intended to replace normal memory cells ("redundant case"), the redundant lines are triggered instead of the normal lines. This is effected via so-called redundant decoders, which are programmable to the address of the respective normal line having the defective memory cells to be replaced.

FIG. 5 shows schematically a heretofore known and used integrated semiconductor memory 1 having a redundant device 2. The memory 1 includes normal memory cells, which are arranged in a matrix at intersections of word lines and bit lines 3,4, which are not otherwise illustrated in detail; the bit lines are organized in a conventional manner pairwise in bit lines 3 and complementary bit lines 4, and pairwise have internal reading circuits which are arranged in the cell matrix of the memory cells but are not shown in detail in FIG. 5, each bit line 3,4 typically including two halves, one of which is disposed on the right-hand side in FIG. 5 and the other on the left-hand side of the figure. Otherwise nonillustrated word line decoders are provided for selecting a word line as a function of word line address signals which are applicable to the semiconductor memory, and bit line decoders 5 are provided to select a bit line 3,4 as a function of bit line address signals which are applicable to the semiconductor memory; in a conventional manner, the bit line decoders 5 are preceded by bit line precharging devices 6, by means of which the bit lines 3,4 are charged to a precharge potential before the data are read out. At one input of the bit line precharge device 6 is a signal AIC (=address input column), from which column address signals are derived for triggering the bit line decoder 5. At the output of the bit line decoder 5 are column select signals CSLS which, in a conventional manner, are supplied to activate switches 7 for selecting the bit lines 3,4. Also assigned to the bit lines 3,4 of the normal memory cells are external reading and evaluator circuits 8 (generally known as read amplifiers), which are disposed outside the cell matrix and connected on the output side with data lines DL0, DL1, DL2, DL3, at which the data contents to be read out of the normal memory cells are output, and on the input side with external bit lines BE0, BE1, BE2, BE3 and complementary lines thereof, also known as I/O lines. The memory 1 also has redundant memory cells (not otherwise shown in detail), which are addressable for replacing a defective memory cell by means of a programmable redundant decoder 9. To that end, the redundant decoder 9 has a programming device, which is otherwise not shown in detail, assigned thereto for programming a column address of the redundant memory cells; this programming device having conventional fuse elements which can be interrupted by the action of light or electric current. The redundant decoder 9, at an output side thereof at which the column address signal AIC is also located, on the one hand, outputs a redundance inhibit signal REDINH for controlling the bit line pre-charge device 6, and, on the other hand, a redundant selection signal RED for triggering switches 10, which enable the selected redundant bit lines 11 and redundant bit lines 12 complementary thereto to be connected with the reading circuits 8 so that, in the redundant case, the data contents of the redundant memory cell (not shown in further detail), instead of the normal memory cell, can be output to the data lines DL0 to DL3.

From the schematic diagram of FIG. 1, illustrating the chronological sequence of redundance provisions in a heretofore known or prior-art semiconductor memory in use, a disadvantage of the mode of operation of the known redundant device is explained hereinafter in connection with FIG. 5. In the redundant case, it is necessary for the decoding of the normal bit lines 3,4 to be blocked, so that an unambiguous redundant bit line signal can be read out by the external reading and evaluator circuits 8. Because the redundant bit lines 11,12 are connected, together with the normal bit lines 3,4, to the same external reading and evaluator circuits 8, and therefore only data from normal memory cells or only data from redundant memory cells can ever be read out, the bit line decoder 5 or the bit line precharge device 6 must be enabled by the redundant decoder 9 if it is to be possible for the data to be read out of normal memory cells.

The conventional or heretofore known arrangement of a redundant device also has the disadvantage that in each individual memory field block unit, only at most as many normal bit lines as there are redundant bit lines of such a memory field block unit can be replaced by redundant bit lines. Each memory field block unit is understood to be a unit having a eight arrays and memory cell blocks, respectively, of memory cells, which are activatable and operatable independently of one another in a conventional manner. In the operation of such a semiconductor memory, not all of the units are operated simultaneously; rather, only some of the memory field block units or operated at any one time. To that end, each memory field block unit can be selected by means of a block selection signal associated with the particular memory field block unit. The selection is effected by means of a block decoder, not shown in further detail, which is controlled by a first portion of the word line address signals (and signals complementary thereto), all of the memory field block units being activated simultaneously. In actual practice, this can mean that such a semiconductor memory contains more normal bit lines with defective memory cells in a memory field block unit than redundant bit lines with suitable redundant memory cells in that same memory field block unit. Hence, such a memory cannot be repaired using the redundant architecture known heretofore, even though there may still be enough redundant bit lines with redundant memory cells in other memory block units than the memory field block units under consideration, which are not being used in these other memory field block units.

SUMMARY OF THE INVENTION

It is accordingly an object of the invention to provide an integrated semiconductor memory having a redundant device which, when required, i.e., in the presence of defective memory cells, ensures a better utilization of the redundant device, has only minimal space requirements, imposes a reduced load on the control lines, and has faster access also to the redundant memory cells to be used when required.

With the foregoing and other objects in view, there is provided, in accordance with the invention, an integrated semiconductor memory having a redundant device with normal memory cells, which are arranged in a matrix at intersections of word lines and bit lines, word line decoders for selecting a word line as a function of word line address signals which are applicable to the semiconductor memory, bit line decoders for selecting a bit line as a function of bit line address signals which are applicable to the semiconductor memory, external reading and evaluator circuits associated with the bit lines of the normal memory cells and connected on an output side thereof with data lines at which data content to be read out of the normal memory cells is to be output, and redundant memory cells which, by means of at least one programmable redundant decoder, are addressable for replacing a defective memory cell, comprising external redundant reading and evaluator circuits triggerable by the at least one programmable redundant decoder and being associated with the redundant memory cells, the external redundant reading and evaluator circuits being connectible on the input side with the redundant memory cells and on the output side with the data lines, and a redundant control circuit associated with each of the external redundant reading and evaluator circuits triggerable by the at least one programmable redundant decoder, the redundant control circuit being connected to and between the respective associated external redundant reading and evaluator circuit and the data lines and, as a function of a redundant selection signal which is output by the redundant decoder, enabling the data content of a redundant memory cell, which is present at the output of an external redundant reading and evaluator circuit, to be transmitted to a selected data line.

In accordance with another feature of the invention, the redundant memory cells are disposed along redundant bit lines, and the programmable redundant decoder is a redundant bit line decoder having a programming device for selecting a redundant bit line of the redundant memory cells.

In accordance with a further feature of the invention, the redundant bit lines are arranged in pairs, and at least every redundant bit line pair has assigned thereto exclusively one of the external redundant reading and evaluator circuits.

In accordance with an added feature of the invention, the integrated semiconductor memory includes switches assigned to the redundant bit lines, the switches being actuatable by a redundant selection signal output from the redundant decoder for effecting the connection of the redundant bit lines to the external redundant reading and evaluator circuits, respectively, assigned thereto.

In accordance with an additional feature of the invention, the normal memory cells are arranged in a plurality of memory field block units individually activatable via activation devices operatively associated therewith, the activatable memory field block units being activatable by means of block selection signals.

In accordance with yet another feature of the invention, redundant memory cells for replacing defective memory cells within one of the memory field block units are activatable from at least two different memory field blocks of the units thereof.

In accordance with yet a further feature of the invention, the programming device has a programmable element for effecting the programmability of the redundant decoder, the programmable element having fuse elements which are interruptible by action of light or electric current.

In accordance with yet an added feature of the invention, the integrated semiconductor memory is comprised of a semiconductor dynamic random access memory (DRAM).

In accordance with a concomitant feature of the invention, the dynamic random access memory has memory cells of 4 MBs, 16 MBs, or more.

Thus, the integrated semiconductor memory according to the invention is distinguished in that redundant reading circuits triggerable by the at least one programmable redundant decoder are associated with the redundant memory cells and communicate on the input side with the redundant memory cells and on the output side with the data lines. By providing the redundant memory cells with their own reading circuits, the bit line decoder no longer needs to be enabled by the redundant decoder as in the conventional or heretofore known memory, and this advantageously shortens the address transit time. Whereas, in contrast with the prior art wherein, as a rule, the redundant data of a redundant cell intended to replace the defective memory cell is not effected until the normal column decoder has been enabled by the redundant decoder, which makes for an access time lag, the central arrangement of the redundant circuit according to the invention permits the decision as to whether normal or redundant data are to be output to be deferred until the actual data is output. This produces considerable reduction in the access time, approximately on an order of magnitude of 2 ns (2 nanoseconds). Moreover, the arrangement according to the invention permits a flexible assignment of the redundant bit lines to various data lines and, in particular, it becomes possible to use redundant bit lines of simultaneously selected memory blocks with one another. Despite the added expenditure for circuitry because of the additional reading circuits to be provided for the redundant memory cells, better utilization of the redundant memory cells is ensured by the redundant arrangement of the invention, because memory cells from other memory cell blocks and units can be replaced with redundant memory cells, so that if the number of redundant memory cells remains the same in comparison with the heretofore known redundant arrangements, considerably more redundant memory cells are usable.

In a further construction of the invention, the redundant memory cells are disposed along redundant bit lines, and the programmable redundant decoder is a redundant bit line decoder provided with a programing device and serving for the selection of a redundant bit line of the redundant memory cells. The redundant bit lines may be arranged pairwise in regular redundant bit lines and complementary redundant bit lines, and at least every redundant bit line pair has its own external redundant reading circuit assigned thereto.

In another construction of the invention, a redundant control circuit is associated with each of the redundant reading and evaluator circuits which are triggerable by at least one programmable redundant decoder, which is connected between and to the respective associated redundant reading circuit and the data lines and, as a function of a redundant selection signal which is output by the redundant decoder, enables the data content of a redundant memory cell, present at the output of a redundant reading circuit, to be transmitted to a selected data line.

Provision may be made for switches to be assigned to the redundant bit lines, the switches being actuated by a redundant selection signal output from the redundant decoder and effecting a connection of the redundant bit lines with the associated redundant reading circuits.

In a further feature of the invention, the memory cells are organized in a number of memory field block units, and a number of memory cell blocks are arranged in each memory field block unit. In operation, all of the memory field block units are not activated and operated simultaneously; on the contrary, only one memory field block unit is activated and operated at any one time. To that end, each memory field block unit is selectable by means of a block selection signal assigned to the individual memory field block unit. The arrangement of the redundant device according to the invention thus makes it advantageously possible for the redundant memory cells within one memory field block unit for replacing defective memory cells to be activatable from at least two different memory field blocks. In this manner, considerably better utilization of the redundant memory cells than in the heretofore known embodiment, wherein only redundant memory cells from a given memory field block were ever activatable, are assured.

Other features which are considered as characteristic for the invention are set forth in the appended claims.

Although the invention is illustrated and described herein as embodied in an integrated semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, wherein:

DESCRIPTION OF THE PREFERRED EMBODIMENTS

Figure 2:
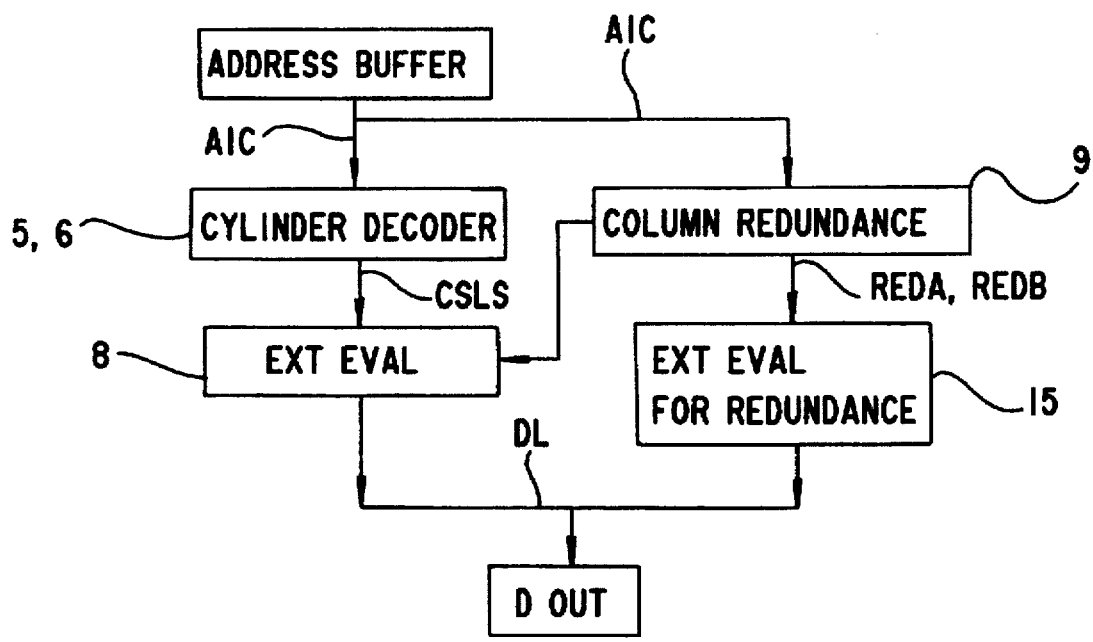
FIG. 2 is a corresponding schematic diagram of the chronological sequence of redundance provisions in a semiconductor memory according to the invention.
Figure 3:
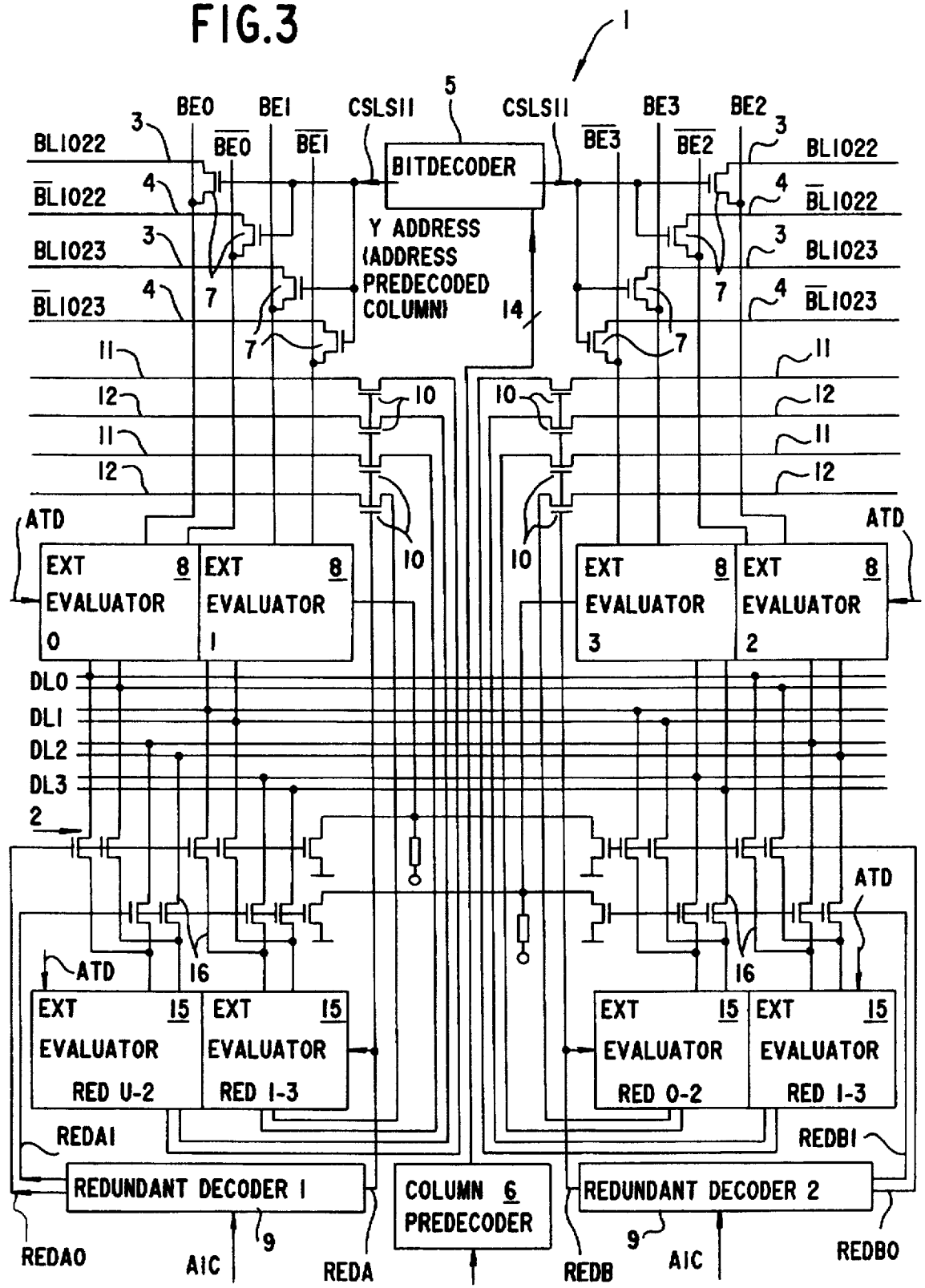
FIG. 3 is a diagrammatic and schematic illustration of a semiconductor memory with a redundant device in accordance with an exemplary embodiment of the invention.
Figure 4:
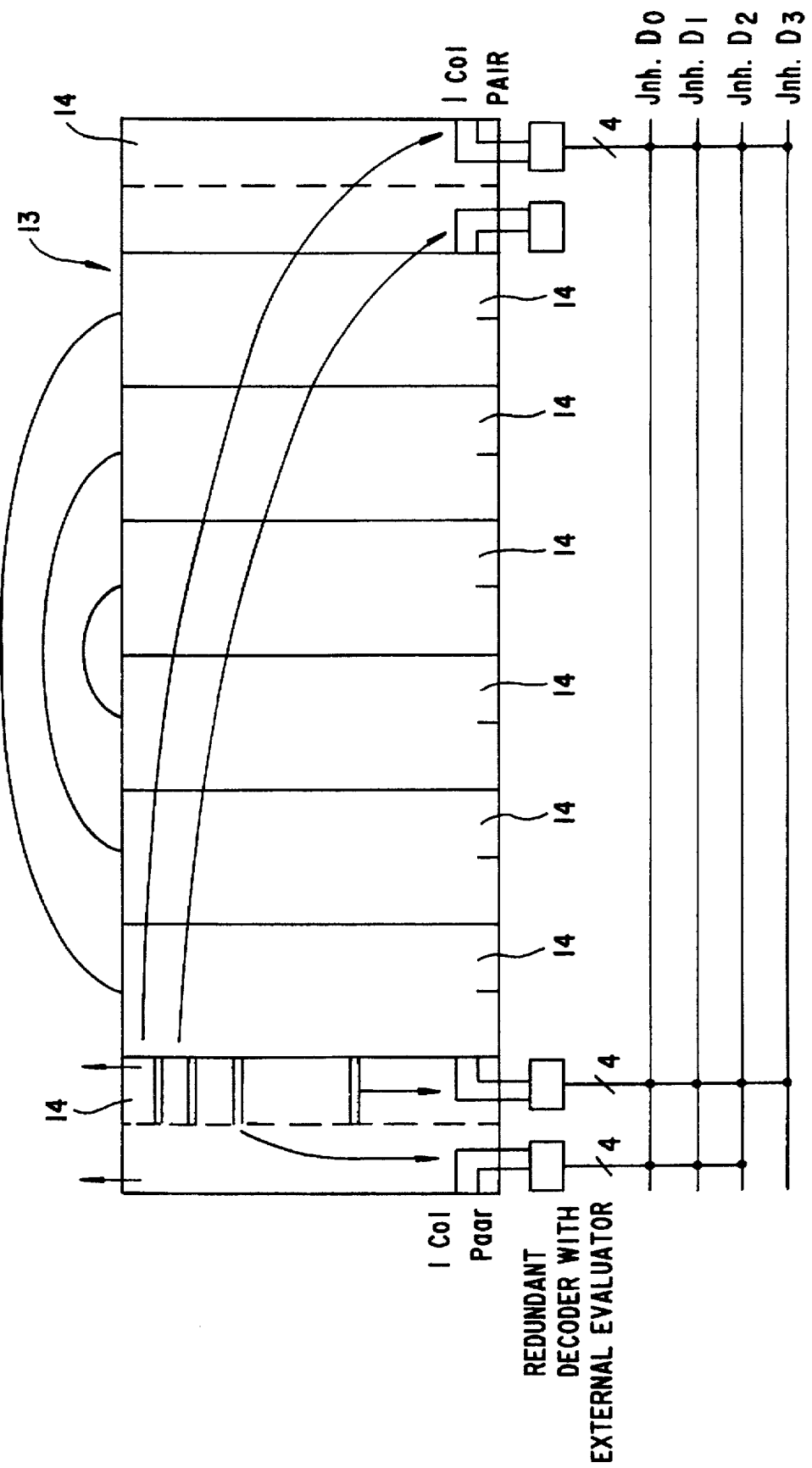
FIG. 4 is a schematic diagram of a memory field block unit forming a part of the semiconductor memory of the invention with a redundant device, and showing further details thereof.
Figure 5:
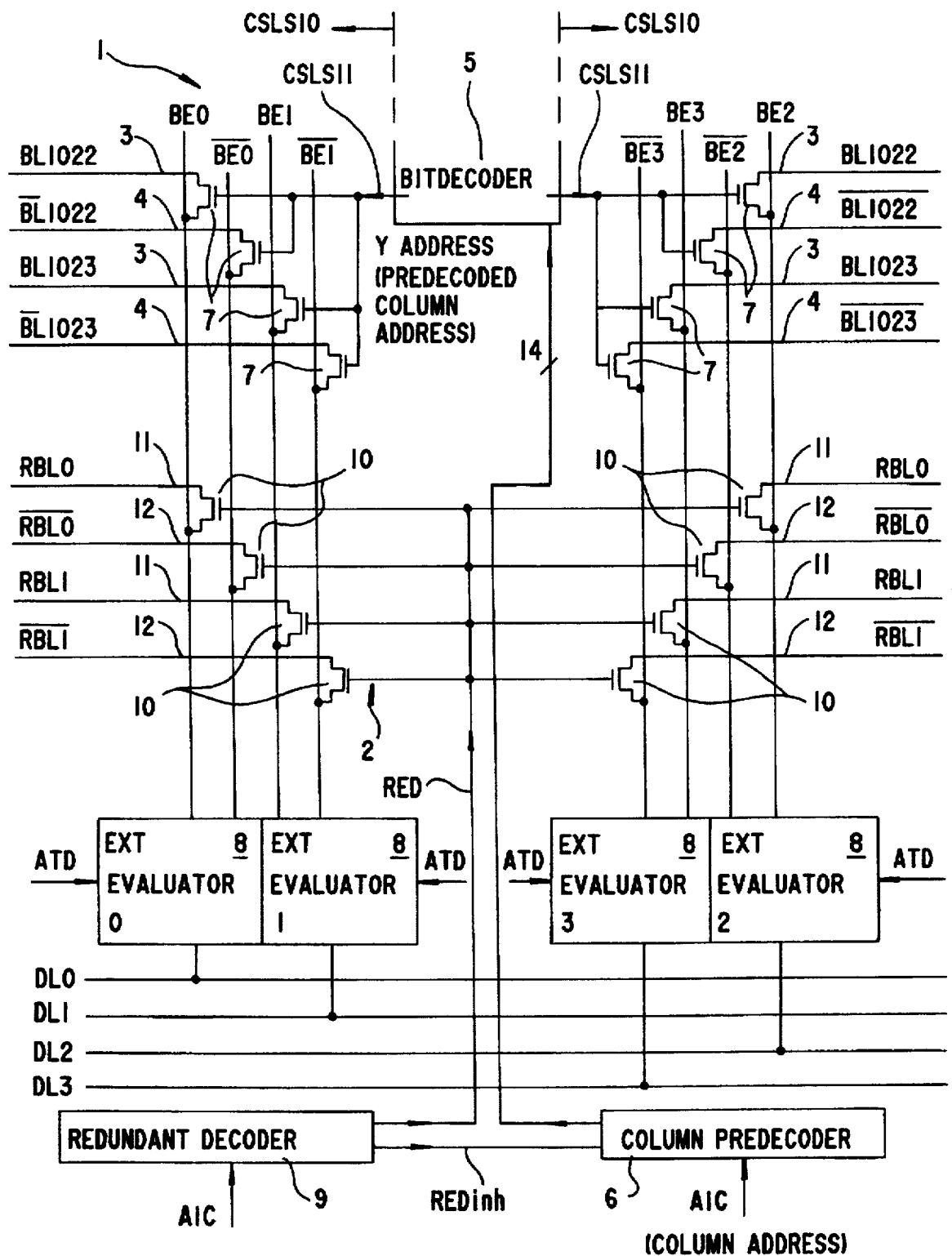
FIG. 5 is, as herein aformentioned, a semiconductor memory with redundant device of the prior art.

Referring now to the drawings and, more particularly, to FIGS. 2 to 4 thereof, there is shown therein diagrammatically and schematically a preferred embodiment of the semiconductor memory device according to the invention, having a redundant device 2 embodied on a semiconductor substrate for replacing a defective memory cell by a redundant memory cell also disposed on the semiconductor substrate. Where activated signals or signals in the activated state are referred to, these signals are meant to have the state "logic 1"; otherwise, they have the state "logic 0". This involves what is known as positive logic and is used solely in the interest of simplifying the explanation. Other logic conventions are naturally possible as well. The semiconductor memory device shown is a 16 MB semiconductor dynamic memory with random access ("DRAM"), and it has four memory field block units, for example, with memory cells contained therein. The memory field block units are of identical construction from a circuitry standpoint; one memory field block unit 13 is shown in further detail in FIG. 4. Each memory field block unit 13 is understood to be a unit having eight arrays and memory cell blocks 14, respectively, of memory cells, which are activatable and drivable independently of one another in a conventional manner. The memory cells arranged in the blocks 14, respectively, in a quantity of 512 k will, for purposes of terminology, be called normal memory cells, the addressing and operation of which can be performed in a conventional manner without the aid of any redundant circuitry of any kind. The normal memory cells are arranged along and are hence addressable via normal word lines (not shown in further detail in the drawing) and along normal bit lines 3,4, each normal bit line typically including two halves. The reading circuits 8 (read amplifiers) are connected to the normal bit lines 3,4 via switches 7. The memory cells are thus addressable via the respectively associated normal bit lines and normal word lines by means of address signals which are applicable to the semiconductor memory, typically by the well known address multiplexing method. In a conventional manner, at a first instant of time, the word line address signals responsible for the word line addressing are buffer-stored in a word line address buffer controlled by a clock signal/RAS. At a second instant of time, the bit line address signals responsible for the bit line addressing are buffer-stored in a bit line address buffer controlled by a clock signal/CAS. These address signals appear in true and complementary form at the outputs of the address buffers. In operation, with such a semiconductor memory, all of the memory field block units are not activated and operated simultaneously, but rather, only one memory field block unit is so activated and operated at any one time. To that end, each memory field block unit is selected by means of a block selection signal associated with the respective memory field block unit. The selection is effected by means of a block decoder, not shown in further detail, which is controlled by a first portion of the word line address signals (and of the signals complementary thereto).

According to the invention, the redundant memory cells have their own redundant reading circuits 15 assigned thereto which are triggerable by the programmable redundant decoder 9 and which are connected on the input side with the redundant memory cells and on the output side with the data lines DL0 to DL3. The redundant bit lines 11,12 are arranged pairwise in redundant bit lines 11 and complementary redundant bit lines 12, and every pair of redundant lines has at least one redundant reading circuit 15 of its own assigned thereto. Similarly to the reading circuits 8 assigned to the normal memory cells, the redundant reading circuits 15 also represent components of the conventional reading amplifier, which are also referred to as external evaluators in the drawings. As is readily apparent particularly from FIG. 3, the redundant reading circuits 15 also have assigned thereto redundant control circuits 16, which are connected between the respectively associated redundant reading circuit 15 and the data lines DL0 to DL3 and, as a function of a redundant selection signal REDA1, REDA0 which is output by the redundant decoder 9, enable the data content of a redundant memory cell, a data content present at the output of a redundant reading circuit 15, to a selected data line. A further redundant selection signal REDA controls the switches 10 for the selective connection of the redundant bit lines 11,12 to the associated redundant reading circuits 15 and is simultaneously applied to the redundant reading circuits 15 for activation thereof. The signal ATD also present at the redundant reading circuits 15 is an address transient data signal.

The mode of operation of the redundant device according to the invention as shown in FIGS. 3 and 4 are explained hereinafter in further detail in terms of the schematic illustration of FIG. 2. The address signals AIC which are output by the address buffer, or signals derived therefrom, are applied simultaneously to the normal column decoder 5 and the redundant decoder 9. The data contents of the normal memory cells present on the normal bit lines 3,4 are read out by the reading circuits 8 in the usual way. At the same time, the data contents present in the redundant case are also read out from the redundant memory cells by the redundant reading circuits 15. In the event that a data content from a normal memory cell is then to be replaced with the data content of a redundant memory cell, the (normal) reading circuits 8 are blocked, and the redundant reading circuits 15 are correspondingly enabled to the data lines DL0 to DL3. This occurs in accordance with or as a function of the redundant selection signals REDA, REDB, which are fixedly programmed in accordance with the state of the programming device, and which the redundant decoder 9 outputs to the switches and the redundant control circuit 16.

The redundant memory cells 6 are usable for replacing defective normal memory cells, the defect thereof being such as can occur either in the memory cells to be replaced themselves or in conjunction with the operation thereof, an example being errors in the associated bit lines, read amplifiers, or address decoders.

Figure 1:
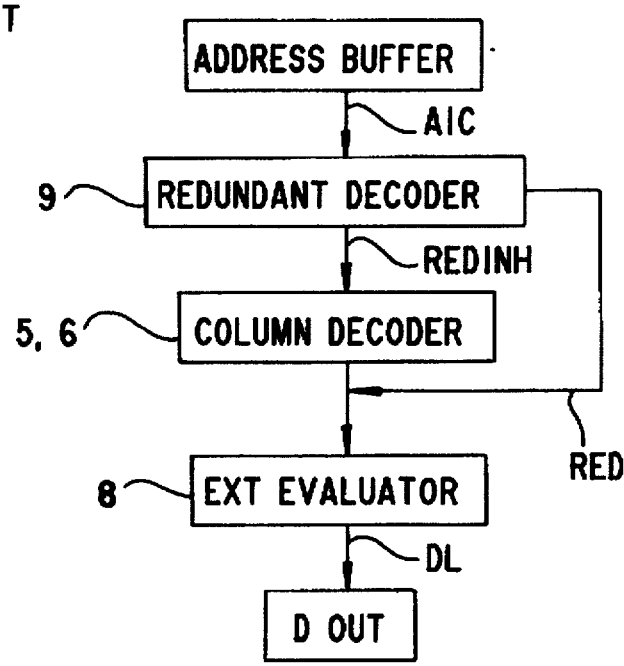
FIG. 1 is a schematic diagram of the chronological sequence of redundance provisions in a heretofore known or prior-art semiconductor memory.

While in the previous conventional construction according to FIG. 1, the normal column decoder in each case must be enabled by the redundant decoder, in the embodiment according to the invention illustrated in FIG. 2, the decision as to whether normal or redundant data are output is not made until the instant of time at which the actual data is output, thereby assuring a speed advantage of about 2 ns.

I claim:

1. Integrated semiconductor memory having a redundant device with normal memory cells, which are arranged in a matrix at intersections of word lines and bit lines, word line decoders for selecting a word line as a function of word line address signals which are applicable to the semiconductor memory, bit line decoders for selecting a bit line as a function of bit line address signals which are applicable to the semiconductor memory, external reading and evaluator circuits associated with the bit lines of the normal memory cells and connected on an output side thereof with data lines at which data content to be read out of the normal memory cells is to be output, and redundant memory cells which, by means of at least one programmable redundant decoder, are addressable for replacing a defective memory cell, comprising external redundant reading and evaluator circuits triggerable by the at least one programmable redundant decoder and being associated with the redundant memory cells, said external redundant reading and evaluator circuits being connectible on the input side with the redundant memory cells and on the output side with the data lines, and a redundant control circuit associated with each of the external redundant reading and evaluator circuits triggerable by the at least one programmable redundant decoder, said redundant control circuit being connected to and between the respective associated external redundant reading and evaluator circuit and the data lines and, as a function of a redundant selection signal which is output by the redundant decoder, enabling the data content of a redundant memory cell, which is present at the output of an external redundant reading and evaluator circuit, to be transmitted to a selected data line.

2. Integrated semiconductor memory according to claim 1, wherein the redundant memory cells are disposed along redundant bit lines, and the programmable redundant decoder is a redundant bit line decoder having a programming device for selecting a redundant bit line of the redundant memory cells.

3. Integrated semiconductor memory according to claim 2, wherein said redundant bit lines are arranged in pairs, and at least every redundant bit line pair has assigned thereto exclusively one of said external redundant reading and evaluator circuits.

4. Integrated semiconductor memory according to claim 3, including switches assigned to said redundant bit lines, said switches being actuatable by a redundant selection signal output from the redundant decoder for effecting the connection of said redundant bit lines to said external redundant reading and evaluator circuits, respectively, assigned thereto.

5. Integrated semiconductor memory according to claim 1, wherein the normal memory cells are arranged in a plurality of memory field block units individually activatable via activation devices operatively associated therewith, said activatable memory field block units being activatable by means of block selection signals.

6. Integrated semiconductor memory according to claim 5, wherein redundant memory cells for replacing defective memory cells within one of said memory field block units are activatable from at least two different memory field blocks of said units thereof.

7. Integrated semiconductor memory according to claim 2, wherein said programming device has a programmable element for effecting the programmability of the redundant decoder, said programmable element having fuse elements which are interruptible by action of light or electric current.

8. Integrated semiconductor memory according to claim 1, comprised of a semiconductor dynamic random access memory DRAM).

9. Integrated semiconductor memory according to claim 8, wherein the dynamic random access memory has memory cells of 4 MBs, 16 MBs, or more.

* * * * *